United States Patent [19]

Yagi et al.

[11] Patent Number: 4,625,520

[45] Date of Patent: Dec. 2, 1986

[54] SUPERCONDUCTING DEVICE

[75] Inventors: Yasuomi Yagi, Hitachi; Ken Takahashi; Takeo Nemoto, both of Ibaraki, all of Japan

[73] Assignee: Hitachi, Ltd., Tokyo, Japan

[21] Appl. No.: 770,577

[22] Filed: Aug. 29, 1985

[30] Foreign Application Priority Data

Sep. 5, 1984 [JP] Japan .................................. 59-184642

[51] Int. Cl.$^4$ ................................................ F17C 1/00
[52] U.S. Cl. ........................................ 62/45; 62/514 R; 220/901
[58] Field of Search ................ 62/45, 514 R; 220/901

[56] References Cited

U.S. PATENT DOCUMENTS

| | | | |
|---|---|---|---|
| 3,309,884 | 3/1967 | Pauliukonis | 62/45 |
| 3,364,688 | 1/1968 | Matlow et al. | 62/45 |
| 3,377,813 | 4/1968 | Mordhorst | 62/45 |
| 4,027,494 | 6/1977 | Fletcher et al. | 62/514 R |

*Primary Examiner*—Ronald C. Capossela
*Attorney, Agent, or Firm*—Antonelli, Terry & Wands

[57] ABSTRACT

A superconducting device including a superconducting coil is suitable for use in a nuclear magnetic resonance computer tomography apparatus which requires a highly-uniform, highly-stable magnetostatic field. However, a serious problem arises when a large-sized superconducting coil is to be installed in a small room of a hospital or the like. A superconducting device capable of solving this problem is disclosed in which a very low temperature vessel having the form of a cylinder contains a superconducting coil in a state that the superconducting coil is immersed in a very low temperature coolant, and very low temperature coolant inlet port communicating the very low temperature vessel for introducing the very low temperature coolant into the very low temperature vessel is provided along a radial direction perpendicular to the horizontal center axis of the superconducting device and inclined at a desired angle with a vertical direction. The above superconducting device can be installed in a small room of a hospital, and makes easy a very low temperature coolant introducing operation.

10 Claims, 9 Drawing Figures

SUPERCONDUCTING DEVICE

BACKGROUND OF THE INVENTION

The present invention relates to a superconducting device, and more particularly to a superconducting device suitable for use in a nuclear magnetic resonance computer tomography apparatus (hereinafter referred to as "NMR-CT apparatus") for medical treatment.

It is well known that when metals such as NbTi and $Nb_3Sn$ are cooled to a very low temperature of about 4.2° K., the resistance of the metals becomes equal to zero, that is, these metals are put in a superconducting state. This phenomenon is utilized for generating a stable, strong magnetostatic field without any power loss.

A superconducting magnet which is formed by using one of the above metals and can generate a strong magnetostatic field stably without producing any power loss, is widely used, as a magnetostatic field generating device, in various industrial apparatuses including an NMR-CT apparatus, a magnetic floating train, and a charged particle focussing apparatus. Specifically, a superconducting coil is most suitable in an NMR-CT apparatus which requires a highly-uniform, highly-stable magnetostatic field, and hence attention has been paid to the superconducting coil in recent years.

In the above industrial apparatuses, a horizontal type superconducting device is widely used in which the central axis of magnetic field generated by a superconducting coil is made parallel to a horizontal direction in order to make it easy to utilize a space where a magnetostatic field is established by the superconducting coil. In more detail, a superconducting magnet can operate stably only in liquid helium (of 4.2° K.) acting as a coolant, and hence is placed in a helium vessel containing liquid helium so as to be immerred in the liquid helium. In this case, it is necessary to prevent heat from the surroundings of ordinary temperature (namely, about 300° K.) from entering into the liquid helium. Usually, a gas helium shield plate of about 20° K. is provided around the helium vessel, a liquid nitrogen shield plate of about 80° K. is provided around the gas helium shield plate, and the helium vessel and the shield plates are placed in a heat-insulating vacuum vessel. Thus, the rate of evaporation of liquid helium which is expensive, is made as small as possible. (Means for maintaining a very low temperature state is disclosed in, for example, Japanese patent examined Publication No. 54-43359 published on Dec. 19, 1979.)

While, in order to operate a superconducting coil, it is necessary to cool the superconducting coil to the liquid helium temperature and to cause an exciting current to flow through the superconducting coil thus cooled. Further, since the amount of liquid helium contained in a helium vessel decreases due to evaporation, it is necessary to resupply liquid helium and to discharge evaporated helium. Accordingly, a superconducting device is usually provided with a pipe for introducing liquid helium into a helium vessel, a pipe for discharging evaporated helium, and a power lead for supplying a current to a superconducting coil. The liquid helium introducing pipe, the helium gas discharge pipe, and the power lead are led to the outside through a liquid helium inlet port provided on the superconducting device.

The conventional, horizontal-type superconducting device is provided with the liquid helium inlet port, at the top part thereof viewed in vertical directions. This is because, when liquid helium is poured from the top part in a vertical direction as in an ordinary liquid storage device, a helium vessel can be filled with liquid helium to the top thereof. That is, in the conventional, horizontal-type superconducting device, liquid helium is introduced into the helium vessel through the liquid helium inlet port provided at the top part of the superconducting device. In order to supply liquid helium to the helium vessel from the liquid helium inlet port provided at the top part, it is required for an operator to couple a transfer tube from a liquid helium tank (namely, a Dewar vessel for storing liquid helium) with the liquid helium inlet port through the aid of a ladder or the like, thereby pouring liquid helium stored in the liquid helium tank, from above the inlet port into the superconducting device.

For such a superconducting device, however, it is required that a space for inserting the transfer tube into the liquid helium inlet port exists above the inlet port, since the inlet port is provided at the top part of the superconducting device. Usually, that portion of the transfer tube which is inserted into the liquid helium inlet port, couples the inlet port of ordinary temperature with the vacuum vessel of 4.2° K. In order to make as small as possible the amount of heat conducted from the outside to the helium vessel, it is required to make the inserted portion of the transfer tube sufficiently long. Thus, in order to supply liquid helium from the liquid helium tank to the helium vessel, it is required that a work space for inserting the transfer tube into the liquid helium inlet port exists above the inlet port and moreover has roughly the same height as the inlet port. The necessity of such a work space arouses a serious problem when the superconducting device is large in size. In more detail, the NMR-CT apparatus is usually used in a hospital or the like, and the problem arises when a large-sized superconducting device included in the NMR-CT apparatus is installed in a small room of the hospital. In other words, when the large-sized superconducting device is placed in the small room, it is difficult to secure a work space for supplying and resupplying liquid helium to a helium vessel.

SUMMARY OF THE INVENTION

It is an object of the present invention to provide a superconducting device which can be installed in a small room of a hospital or the like, makes easy a very low temperature coolant introducing operation, and thus can solve the drawback of the prior art.

In order to attain the above object, according to the present invention, there is provided a superconducting device in which a superconducting coil is set in a very low temperature vessel having a substantially cylindrical form so that the center axis of magnetic field generated by the superconducting coil is parallel to a horizonal direction and the superconducting coil is immersed into a very low temperature coolant contained in the very low temperature vessel, and a very low temperature coolant inlet port communicating with the very low temperature vessel for introducing the coolant into the vessel is provided to extend along a radial direction perpendicular to the horizontal center axis of the superconducting device and inclined at a certain angle with the vertical direction.

DESCRIPTION OF THE PREFERRED EMBODIMENTS

Figure 1:
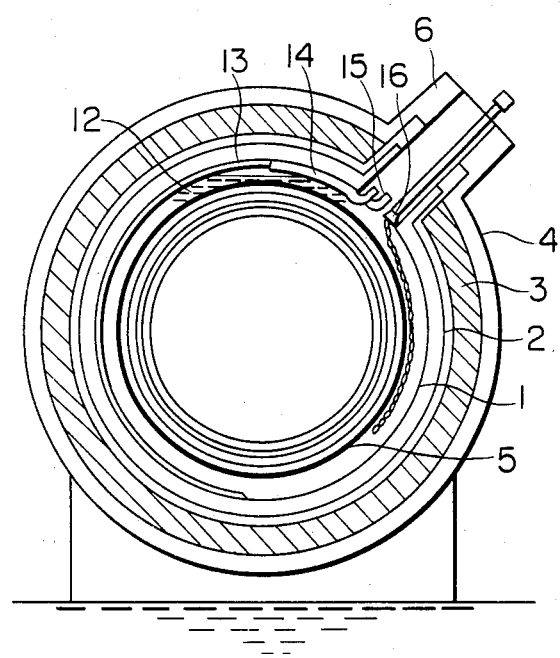
FIG. 1 is a sectional diagram showing an embodiment of a superconducting device according to the present invention.

The present invention will be explained below in detail, on the basis of embodiments depicted in the drawings.

Incidentally, the same reference numerals designate like parts or members throughout the drawings.

Figure 2:
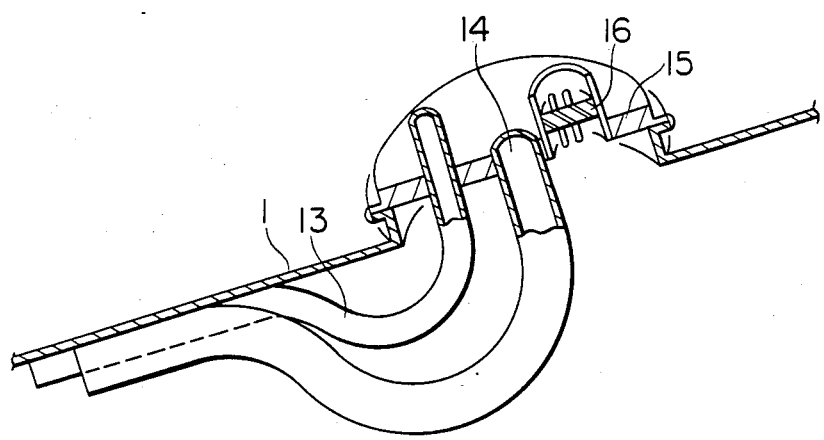
FIG. 2 is a diagram, partly schematic and partly cross-sectional, of a partition plate provided in the liquid helium inlet port of FIG. 1 and the vicinity of the partition plate.
Figure 3:
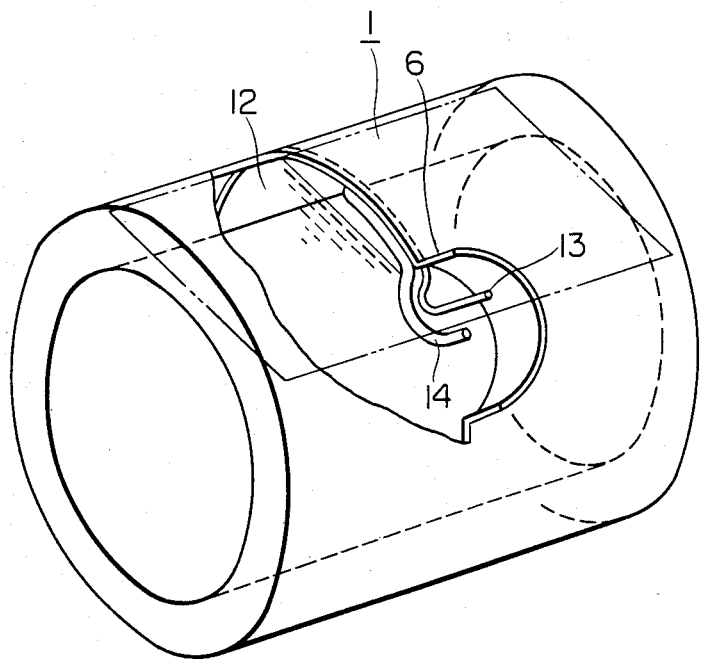
FIG. 3 is a partially cutaway diagram in perspective of the helium vessel of FIG. 1.

FIG. 1 shows, in section, an embodiment of a superconducting device according to the present invention. Referring to FIG. 1, the present embodiment includes a helium vessel 1 for containing a superconducting coil 5 therein in such a manner that the superconducting coil 5 is immersed in liquid helium 12, a helium gas shield plate 2 provided around the helium vessel 1 so that the helium vessel 1 is covered with the shield plate 2, a liquid nitrogen shield plate 3 provided around the helium gas shield plate 2 so that the helium gas shield plate 2 is covered with the shield plate 3, and a heat-insulating vacuum vessel 4 for containing the helium vessel 1, the helium gas shield plate 2 and the liquid nitrogen shield plate 3. The shield plates 2 and 3 and the vacuum vessel 4 prevents heat from the outside of ordinary temperature from entering in the liquid helium 12. In the present embodiment, a liquid helium inlet port 6 is provided along a radial direction which is perpendicular to the horizontal center axis of the embodiment and makes an angle of about 45° with a vertical line taken upwardly from the horizontal center axis, and moreover that portion of the liquid helium inlet port 6 where the inlet port 6 communicates with the helium vessel 1, is lower than the surface of the liquid helium 12 contained in the helium vessel 1. A power lead for supplying an electric current to a superconducting coil, a helium gas discharge pipe 14 for discharging evaporated helium from the helium vessel 1 and a liquid helium introducing pipe 13 for introducing the liquid helium 12 into the helium vessel 1 pass through the liquid helium inlet port 6 which is provided along the radial direction making an angle of about 45° with the vertical line. Further, a partition plate 15 is provided at that end of the liquid helium inlet port 6 which is kept in contact with the helium vessel 1, to prevent the liquid helium 12 in the vessel 1 from flowing backward when the liquid helium 12 is introduced into the helium vessel 1 to such an extent that the surface of the liquid helium 12 is higher than the inlet port 6. The helium gas discharge pipe 14, the liquid helium introducing pipe 13 and a feedthrough 16 for the above-mentioned power lead are supported by the partition plate 15. Detailed mounting of the pipes 13 and 14 and feedthrough 16 to the partition plate 15 is shown in FIG. 2. Referring to FIG. 2, the partition plate 15 is fixed to the helium vessel 1 so that the liquid helium 12 is prevented from leaking in the inlet port 6, and the pipes 13 and 14 and the feedthrough 16 are fixed to the partition plate 15. One end of the helium gas discharge pipe 14 is led to that upper space in the helium vessel 1 which is not filled with the liquid helium 12, and the other end of the discharge pipe 14 is led to the inlet port 6 and supported by the partition plate 15. While, the liquid helium introducing pipe 13 is disposed along the inner wall of the helium vessel 1 so that one end of the pipe 13 reaches the bottom of the helium vessel 1. The other end of the pipe 13 is led to the inlet port 6 and supported by the partition plate 15. Details of the arrangement of the pipes 13 and 14 are shown in FIG. 3. When the liquid helium 12 is introduced into the helium vessel 1, a transfer tube from a liquid helium tank is inserted in the liquid helium introducing pipe 13 at the inlet port 6, to supply liquid helium from the liquid helium tank to the helium vessel 1. Further, helium gas which is produced by evaporation in the helium vessel 1, is led to the inlet port 6 through the helium gas discharge pipe 14 without being stored in an upper portion of the helium vessel 1, and is then discharged to the outside. The power lead for supplying an electric current is connected between the wiring in the helium vessel 1 and the wiring in the inlet port 6, through the feedthrough 16.

Figure 4:
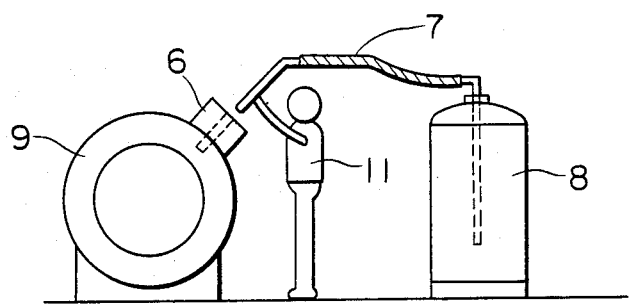
FIG. 4 is a schematic diagram for explaining an operation for introducing liquid helium into the embodiment of FIG. 1.

Next, an operation for introducing liquid helium into the helium vessel 1 will be explained below in detail, with reference to FIG. 4. As shown in FIG. 4, according to the present embodiment, the inlet port 6 is provided along a radial direction of a superconducting device 9 which is inclined at a desired angle with a vertical direction, and hence an operator 11 can insert a transfer tube 7 in the inlet port 6 along the above radial direction without using a ladder or the like, when it is required to supply liquid helium from a liquid helium tank 8 to the device 9.

Although the inlet port 6 of the present embodiment, as mentioned above, is provided along the radial direction which is inclined at the desired angle with the vertical direction, the partition plate 15 prevents the liquid helium 12 in the helium vessel 1 from leaking in the inlet port 6 when the liquid helium is introduced into the helium vessel 1 to an upper portion thereof, and thus the amount of ambient heat transmitted to the helium vessel 1 is not great. Further, evaporated helium is not stored in the helium vessel 1, but is discharged to the outside through the helium gas discharge pipe 14. Thus, the present embodiment can be installed and used in a small chamber of a hospital, and moreover an operation for introducing liquid helium in the helium vessel 1 can be readily performed because the inlet port 6 is provided along a radial direction inclined at a desired angle with a vertical direction.

Figure 5:
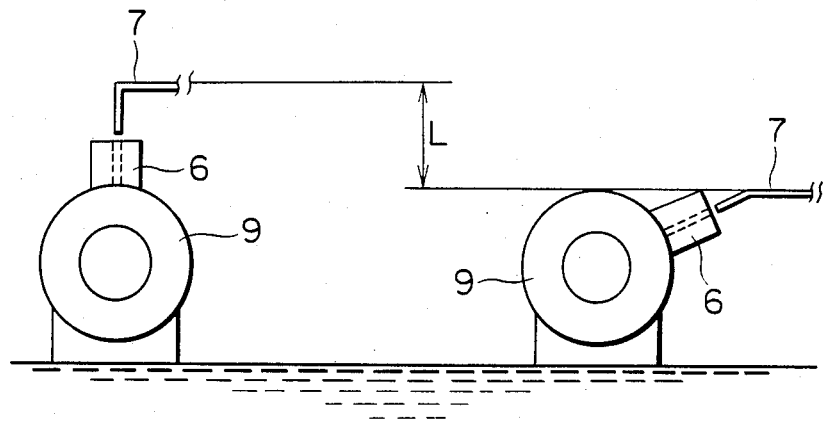
FIG. 5 is a schematic diagram for comparing the height of a superconducting device according to the present invention with that of a conventional superconducting device.

The advantage of the present invention will be explained below in detail. FIG. 5 shows a superconducting device according to the present invention and a conventional superconducting device for the purpose of comparing them. As shown in FIG. 5, the height of the transfer tube 7 coupled with the inlet port 6 of the inventive superconducting device 9 can be made smaller than the height of the transfer tube 7 coupled with the inlet port 6 of the conventional superconducting device 9 by a distance L, since the inlet port 6 of the inventive superconducting device 9 is provided along a radial direction inclined at a desired angle with a vertical direction and the inlet port 6 of the conventional superconducting device is provided, at the top part thereof viewed in vertical directions. That is, according to the present invention, a dummy space required for inserting the transfer tube 7 in the inlet port 6 and for separating the transfer tube 7 from the inlet port 6 can be greatly reduced. Such a reduction in dummy space makes it possible to use a superconducting device according to the present invention in a room having a low ceiling, and hence the superconding device is most suitable for use in an NMR-CT apparatus which is installed in a small room of a hospital or the like. Further, according to the present invention, the height of the transfer tube 7 is reduced by the distance L, as compared with the case where the transfer tube 7 is coupled with the conventional superconducting device, and hence a liquid helium introducing operation can be readily performed.

Figure 6:
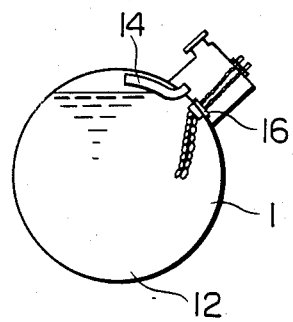
FIG. 6 is a schematic diagram showing the arrangement of a helium gas discharge pipe and a power lead in a superconducting device according to the present invention.
Figure 7:
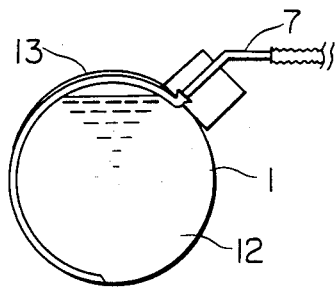
FIG. 7 is a schematic diagram showing the arrangement of a liquid helium introducing pipe in a superconducting device according to the present invention.

In the present embodiment of FIGS. 1 to 4, an upper space in the helium vessel 1 communicates with the inlet port 6 through the helium gas discharge pipe 14 penetrating the partition plate 15. Accordingly, even when the liquid helium 12 is introduced into the helium vessel 1 to an upper portion thereof as shown in FIG. 6, evaporated helium can be discharged through the helium gas discharge pipe 14 without being stored in an upper portion of the helium vessel 1. Further, as shown in FIG. 7, the liquid helium introducing pipe 13 is disposed along the inner surface of the helium vessel 1 from the upper space to the bottom in the helium vessel 1. Accordingly, when the liquid helium 12 is introduced into the helium vessel 1 through the transfer tube 7 coupled with the inlet port 6, the surface of the liquid helium 12 is higher than the inlet port 6 so that the liquid helium 12 never flows backward to the inlet port side.

Figure 8:
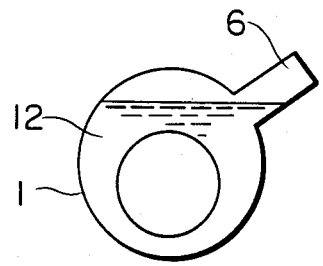
FIGS. 8 and 9 are schematic diagrams showing different examples of means for discharging evaporated helium.
Figure 9:
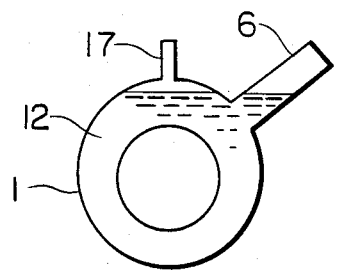

In the above-mentioned embodiment, helium evaporated from the liquid helium 12 is led from an upper space in the helium vessel 1 to the inlet port 6 through the helium gas discharge tube 14, to be discharged to the outside. However, as shown in FIG. 8, the helium vessel 1 may be formed so that central axes of inner and outer cylinders of the helium vessel 1 deviate from each other and a predetermined amount of liquid helium can be stored in the helium vessel 1 in a state that an upper space in the helium vessel 1 communicates directly with the inlet port 6. Alternatively, as shown in FIG. 9, a vent 17 may be provided separately from the inlet port 6, to store a predetermined amount of liquid helium in the helium vessel 1 while discharging evaporated helium through the vent 17.

The present invention can exhibit a remarkable effect when the inlet port 6 is provided to extend along a radial direction which is perpendicular to the horizontal center axis of a superconducting device and makes an angle of 20° to about 60° right-or left-hand with a vertical line taken upwardly from the horizontal center axis, and can produce the greatest effect when the above radial direction makes an angle of about 45° with the vertical line.

As has been explained in the foregoing, in a superconducting device according to the present invention, a superconducting coil is set in a very low temperature vessel having a substantially cylindrical form so that the central axis of magnetic field generated by the superconducting coil is parallel to a horizontal direction and the coil is immersed in a very low temperature coolant contained in the very low temperature vessel, and a very low temperature coolant inlet port communicating with the very low temperature vessel for introducing the very low temperature coolant into the very low temperature vessel is provided along a radial direction of the superconducting device which is perpendicular to the horizontal center axis of the superconducting device and is inclined at a desired angle with a vertical direction. Accordingly, a superconducting device according to the present invention can be installed in a small room of a hospital or the like, and makes easy a very low temperature coolant introducing operation. Thus, the present invention is very effective for a superconducting device of this kind.

We claim:

1. A superconducting device comprising a superconducting coil, a vessel structure having, in an installed position, a substantially cylindrical form with a longitudinal center axis extending substantially horizontally, said vessel structure inlcuding an inner vessel filled with a cryogenic coolant and mounting said superconducting coil therein, and a heat-insulating outer shield heat-insulatively covering said inner vessel, and a coolant inlet port fixed to said vessel structure and communicated with said inner vessel for supplying the coolant to said inner from outside of said vessel structure, said inlet port extending radially and outwardly of said vessel structure at an angle with a line vertical to the center axis of said vessel structure in the installed position.

2. A superconducting device according to claim 1, wherein said superconducting coil is mounted in said vessel with its magnetic axis parallel to the center axis of the vessel structure.

3. A superconducting device according to claim 1, wherein said angle is an angle of at least 20°.

4. Superconducting device according to claim 3, wherein said angle is an angle of 45°.

5. A superconducting device according to claim 1, wherein said inlet port communicates with said inner vessel at a portion thereof at a position lower than a level of the coolant filled in said inner vessel.

6. A superconducting device according to claim 1, further comprising a coolant introducing pipe extending along an inner surface of said inner vessel from one end communicated with said inlet port to the opposite end thereof disposed in said inner vessel.

7. A superconducting device according to claim 1, further comprising gas discharge means for discharging a gas evaporated from the coolant in said inner vessel outside of said vessel structure.

8. A superconducting device according to claim 7, wherein said gas discharging means includes a gas discharging pipe having one end communicated with said inlet port and an opposite end thereof disposed in said inner vessel at a position higher than the level of the coolant filled in said inner vessel.

9. A superconducting device according to claim 1, further comprising a power lead extending through said inlet port for supplying electric power to said superconducting coil.

10. A superconducting device comprising a superconducting coil, a vessel structure formed in a substantially cylindrical shape and having, in an installed position, a center axis extending substantially in a horizontal direction, said vessel structure including an inner vessel for mounting therein said superconducting coil with its magnetic axis parallel to the center axis and filled with a cryogenic coolant, and an outer shield covering said inner vessel for heat-insulating said inner vessel from outside of said vessel structure, and means for supplying the coolant to said inner vessel from outside of said vessel structure, said means including a coolant inlet port fixed to said inner vessel with a partition disposed therebetween for preventing leakage of the coolant from said inner vessel into said inlet port, and means for communicating said inlet port with said inner vessel through said partition for introducing these coolant supplied from said inlet port into said inner vessel, said inlet port extending radially and outwardly of said vessel structure at an angle with a line vertical to the center axis of said vessel structure in the installed position.

* * * * *